(12) United States Patent
Mandai (10) Patent No.: US 7,477,499 B2
(45) Date of Patent: Jan. 13, 2009

(54) SWITCHING ELEMENT AND PROTECTION CIRCUIT USING THE SAME

(75) Inventor: Tadao Mandai, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 397 days.

(21) Appl. No.: 11/244,391

(22) Filed: Oct. 6, 2005

(65) Prior Publication Data

US 2006/0076931 A1    Apr. 13, 2006

(30) Foreign Application Priority Data

Oct. 8, 2004    (JP)    ............................. 2004-296472

(51) Int. Cl.
*H02H 9/00*    (2006.01)
*H02J 7/00*    (2006.01)
(52) U.S. Cl. .......................... 361/58; 320/124; 320/134
(58) Field of Classification Search .................. 361/58; 320/134, 128
See application file for complete search history.

(56) References Cited

U.S. PATENT DOCUMENTS 5,689,209 A * 11/1997 Williams et al. ............ 327/425

6,373,225 B1 * 4/2002 Haraguchi et al. .......... 320/122

FOREIGN PATENT DOCUMENTS

| CN | 1327276 A | 12/2001 |
|---|---|---|
| JP | 07-227045 | 8/1995 |
| JP | 10-012282 | 1/1998 |

* cited by examiner

*Primary Examiner*—Stephen W Jackson
*Assistant Examiner*—Lucy Thomas
(74) *Attorney, Agent, or Firm*—Morrison & Foerster LLP (57) ABSTRACT

Provided is a switching element including: first switching element primarily used for formation of a two-way current path; a second switching element that forms, at the time when the first switching element is turned off, a current path by switching a parasitic diode from another; and a third switching element. The second and third switching elements may be of smaller chip size because they allow a current to flow through them only while the current path of the first switching element is being switched. This contributes miniaturization of the switching element as well as reduction in the ON resistance. Moreover, adoption of the switching element to a protection circuit realizes miniaturization of the protection circuit.

11 Claims, 5 Drawing Sheets

Prior Art

SWITCHING ELEMENT AND PROTECTION CIRCUIT USING THE SAME

BACKGROUND OF THE INVENTION

1. Field of the Invention

The present invention relates to a switching element and a protection circuit using the switching element. More specifically, the present invention relates to a switching element that can switch a current path in two directions and has a reduced chip size, and to a protection circuit using the switching element.

2. Description of the Related Art

As a switching element, a switching element that not only switches a device between ON and OFF but also switches the direction of a current path (the direction in which a current path flows) is also under development, and such a switching element is adopted, for example, to a protection circuit of a secondary battery.

Figure 5:
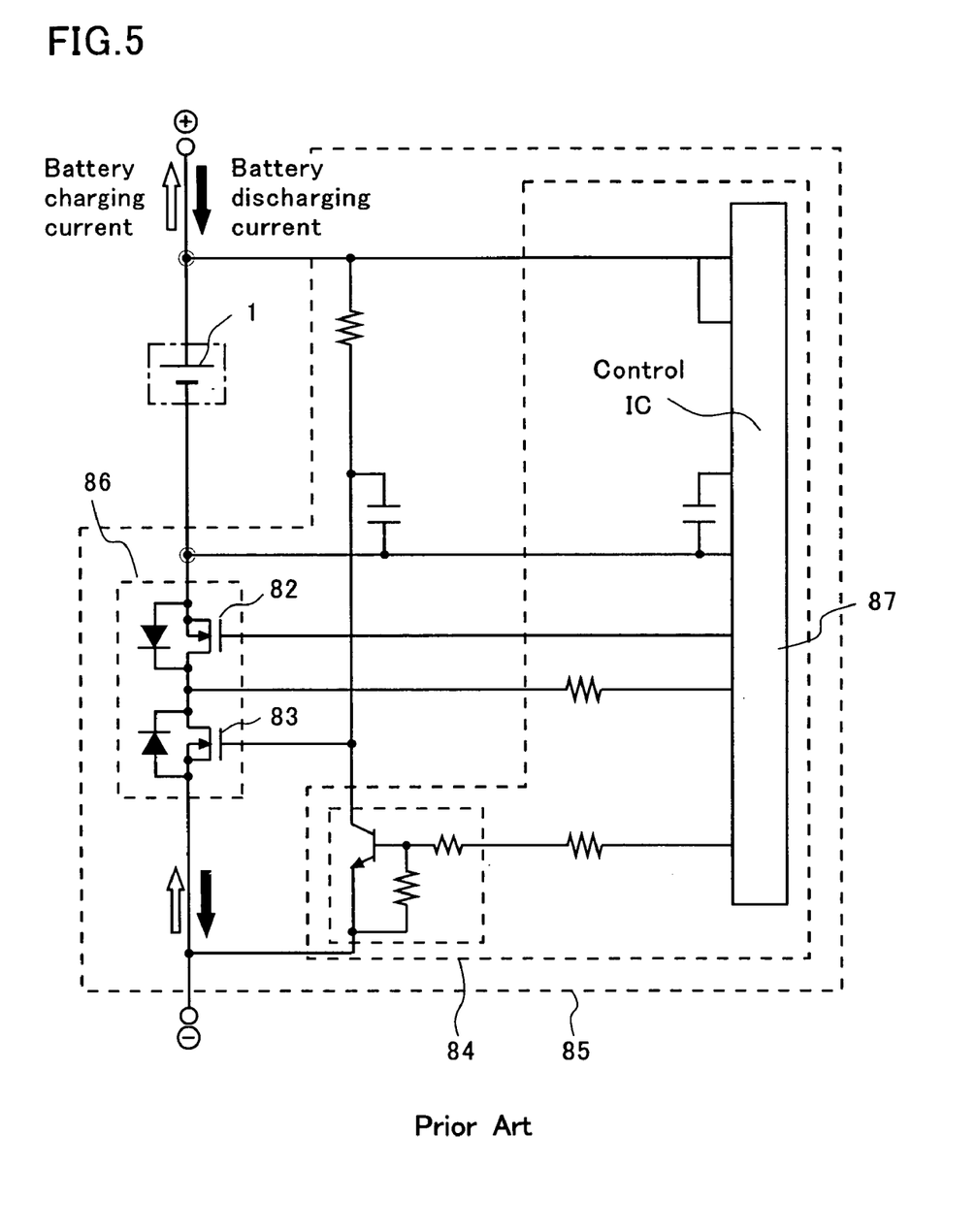
FIG. 5 is a circuit diagram of a conventional protection circuit.

As an example of a conventional two-way switching element, FIG. 5 shows a circuit diagram of a protection circuit for a secondary battery.

A two-way switching element 86 has an overdischarge-prevention switching element 82 connected in series to an overcharge-prevention switching element 83, and a control circuit 84 performs an ON-OFF control.

The control circuit 84 detects the battery voltage and switches the overcharging-prevention switching element 83 off at the time when the detected voltage is higher than the maximum set voltage, thereby preventing a secondary battery 1 from being overcharged. In addition, the control circuit 84 switches the overdischarge-prevention switching element 82 off at the time when the detected voltage is lower than the minimum set voltage, thereby preventing the secondary battery 1 from being overdischarged.

The overdischarge-prevention switching element 82 and the overcharge-prevention switching element 83 have a small internal resistance in their ON states, and are constituted of MOSFETs that can achieve reduced power loss and voltage drop. The MOSFETs have parasitic diodes and, therefore, even when the MOSFETs are in OFF state, a current path can be formed in a desired direction by use of the parasitic diodes.

Therefore, even when the battery voltage becomes higher than the maximum set voltage and thus the MOSFET of the overcharge-prevention switching element 83 is turned off, for instance, the secondary battery 1 can be discharged using the parasitic diodes.

Meanwhile, even when the battery voltage becomes lower than the minimum set voltage and thus the MOSFET of the overdischarge-prevention switching element 82 is turned off, the secondary battery 1 can be charged using the parasitic diodes.

The protection circuit 85 shown in FIG. 5 operates in the manner described above and prevents the secondary battery 1 from being overcharged and overdischarged. This technology is described for instance in Japanese Patent Application Publication No. Hei. 10-12282 (page 7, FIG. 1).

As described above, in the conventional technologies, one of switching elements is set to as the overcharge-prevention switching element 83 for preventing the secondary battery from being overcharged, and the other one of the switching elements is set to as the overdischarge-prevention switching element 82 for preventing the secondary battery 1 from being overdischarged, thereby realizing the two-way switching element 86. Such a two-way switching element 86 is obtained by connecting two switching elements (MOSFETs) of the same size in series, but it prevents miniaturization of size as well as progress in reduction of the manufacturing costs.

SUMMARY OF THE INVENTION

The present invention provides a switching device that includes a first switching element, a second switching element and a third switching element, each of the switching elements comprising a control terminal, a first power terminal, a second power terminal and a back gate, wherein the first power terminal of the second switching element is connected with the first power terminal of the first switching element, and the second power terminal of the second switching element is connected with the back gates of the first and second switching elements, and the first power terminal of third switching element is connected with the second power terminal of the first switching element, and the second power terminal of the third switching element is connected with the back gates of the first and third switching elements.

The present invention also provides a protection circuit for a secondary battery that includes a switching device comprising a first switching element, a second switching element and a third switching element, the first switching element being connected with the secondary battery in series, the second switching element being connected with the third switching element in series, and the connected second and third switching elements as a whole being connected with the first switching element in parallel, and a control device controlling the first, second and third switching elements so that the secondary battery is charged when a current flows in a first direction through the switching device and the secondary battery is discharged when a current flows in a second direction through the switching device.

DESCRIPTION OF THE PREFERRED EMBODIMENTS

The embodiments of the present invention will be described in detail with reference to FIGS. 1 to 4.

Figure 1A:
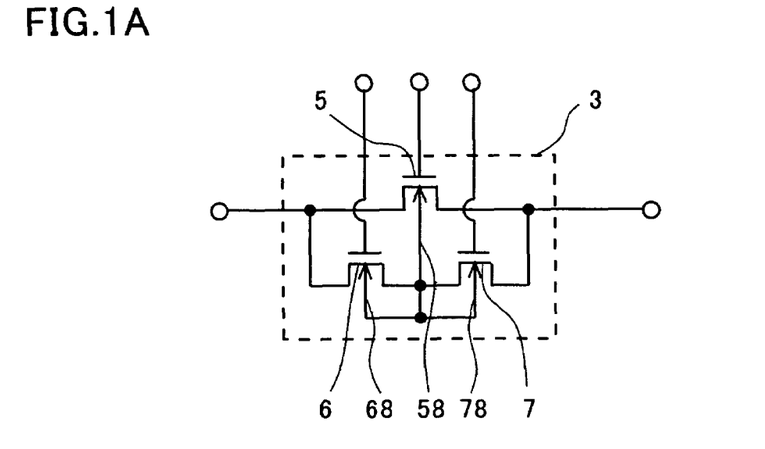
FIG. 1A is a circuit diagram for explaining a switching element according to a first embodiment of the present invention.
Figure 1B:
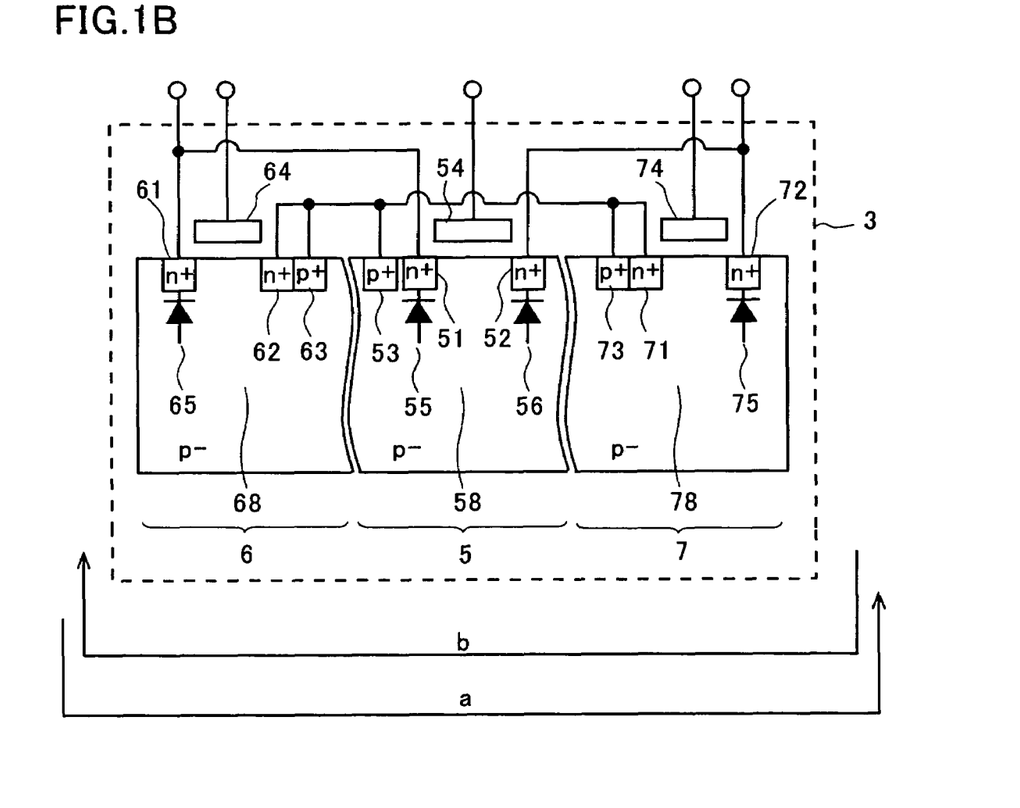
FIG. 1B is a schematic cross section of the circuit diagram for explaining the switching element according to the first embodiment of the present invention.

FIGS. 1A and 1B show a first embodiment of the present invention. FIG. 1A is a circuit diagram of a switching element, and FIG. 1B is a schematic cross section of the switching element.

A switching element 3 of the first embodiment includes a first MOSFET 5, a second MOSFET 6 and a third MOSFET 7.

The drain (or source) of the second MOSFET 6 is connected to the drain (or source) of the first MOSFET 5. Additionally, the source (or drain) of the second MOSFET 6 is connected to a back-gate 68 of the second MOSFET 6 and to a back-gate 58 of the first MOSFET 5.

The source (or drain) of the third MOSFET 7 is connected to the source (or drain) of the first MOSFET 5. Additionally, the drain (or source) of the third MOSFET 7 is connected to a back-gate 78 of the third MOSFET 7 and to the back-gate 58 of the first MOSFET 5.

Referring to FIG. 1B, the structure of the switching element 3 will be described. It should be noted that sources are equivalent to drains in the present embodiments, and therefore may be replaced by drains in the following descriptions.

The first, second and third MOSFETs 5, 6 and 7 are, for example, n-channel MOSFETs. In the first MOSFET 5, an n(+)-type source 52 and an n(+)-type drain 51 are provided on a p(−)-type substrate that constitutes the back-gate 58. Furthermore, a p(+)-type back-gate contact 53 is provided on the p(−)-type substrate for the purpose of reducing the contact resistance of the back-gate 58.

The second MOSFET 6 is similar to the first MOSFET 5. In the second MOSFET 6, an n(+)-type source 62 and an n(+)-type drain 61 are provided on a p(−)-type substrate that constitutes the back-gate 68. Furthermore, a p(+)-type back-gate contact 63 is provided on the p(−)-type substrate. The source 62 and the back-gate 68 (the back-gate contact 63) are then shorted to each other, thereby connecting them to the back-gate 58 (the back-gate contact 53) of the first MOSFET 5.

In the third MOSFET 7, an n(+)-type source 72 and an n(+)-type drain 71 are provided on a p(−)-type substrate that constitutes the back-gate 78, and a p(+)-type back-gate contact 73 is also provided thereon. The drain 71 and the back-gate 78 (the back-gate contact 73) are then shorted to each other, thereby connecting them to the back-gate 58 (the back-gate contact 53) of the first MOSFET 5.

In addition, the drain 61 of the second MOSFET 6 is connected to the drain 51 of the first MOSFET 5, and the source 72 of the third MOSFET 7 is connected to the source 52 of the first MOSFET 5.

In the first MOSFET 5, parasitic diodes 55 and 56 are formed on the substrate depending on the operation state.

Meanwhile, the second MOSFET 6 is at the same potential when the back-gate 68 becomes shorted to the source 62. Thus, only one parasitic diode 65 is formed in the second MOSFET 6, and only one parasitic diode 75 is formed in the third MOSFET 7 for the same reason.

Control signals are applied to gates 54, 64 and 74 respectively of the first, second and third MOSFETs 5, 6 and 7. In addition, different potentials are applied to the drain 61 of the second MOSFET 6 and to the source 72 of the third MOSFET 7. Depending on the potential difference to be applied and signals to be applied to the gates 54, 64 and 74 respectively of the first, second and third MOSFETs 5, 6 and 7, each of the parasitic diodes 55, 56 and 75 is switched. In this way, a current path, formed between the drain 61 of the second MOSFET 6 and the source 72 of the third MOSFET 7, can switch between two directions.

Next, a specific description will be provided for the operation of the switching element 3 with reference to the drawings.

At the first place, the switching element 3 is in normal ON state while the gate 54 of the first MOSFET 5 is turned on, and regardless of signals applied to the gates 64 and 74 respectively of the second and third MOSFETs 6 and 7, a current flows between the source 52 and drain 51 of the first MOSFET 5. For example, when the drain 51 of the first MOSFET 5 (the drain 61 of the second MOSFET 6) has high potential (H) and the source 52 of the first MOSFET 5 (the source 72 of the third MOSFET 7) has low potential (L), a current flows in the direction of an arrow "a" shown in FIG. 1B. Meanwhile, when the potential relationship between the drain 51 and the source 52 is reverse, a current flows in the direction of an arrow "b". Thus, since the turning on of the first MOSFET 5 allows a current to flow in two directions, the second and third MOSFETs 6 and 7 may be switched on or off.

Next, a description will be provided for a case where the first MOSFET 5 is turned off. When a current path (direction in which a current flows) is intended to be switched by using the switching element 3 that switches a two-way current path, the first MOSFET 5 is turned off. Depending on the applications of the switch, it is sometimes necessary to allow a current to flow in either of two directions even during the switching period (period during which the first MOSFET 5 is turned off) in order to prevent full interruption of current. The switching element 3 of the present embodiment can form, even during the switching period, the current path in which a current flows in either of two directions.

For example, when the first MOSFET 5 is turned off, the switching element 3 turns on any of the second and third MOSFETs 6 and 7, thereby forming the current path by use of the parasitic diodes of the OFF-state MOSFETs.

To be more specific, the first and third MOSFETs 5 and 7 are turned off, and the second MOSFET 6 is turned on. At this point, if the drain 61 of the second MOSFET 6 has high potential and the source 72 of the third MOSFET 7 has low potential, the current path shown by the arrow "a" is formed by use of the parasitic diode 56 of the first MOSFET 5 and the parasitic diode 75 of the third MOSFET 7, both of which are in OFF state. Meanwhile, when the potential relationship between the drain 61 and the source 72 is reverse, a current never flows.

In addition, the first and second MOSFETs 5 and 6 are turned off and the third MOSFET 7 is turned on. At this point, if the source 72 of the third MOSFET 7 has high potential and the drain 61 of the second MOSFET 6 has low potential, the current path shown by the arrow "b" is formed by use of the parasitic diode 55 of the first MOSFET 5 and the parasitic diode 65 of the second MOSFET 6, both of which are in OFF state. Meanwhile, when the potential relationship between the drain 61 and the source 72 is reverse, a current never flows.

As described above, when the first MOSFET 5 is turned off, any one of the second and third MOSFETs 6 and 7 is turned off, and a potential, applied to the terminals (source or drain) leading to the outside of the OFF-state MOSFETs, is set to be lower than that, which is applied to the terminals (source or drain) leading to the outside of the ON-state MOSFETs. In this way, the current path can be formed in which a current flows in two directions, by switching the parasitic diodes that operate on the OFF-state first MOSFET 5 and by using the parasitic diodes of any one of the second and third MOSFETs 6 and 7 that are in OFF state.

Here, the main switch in the embodiment is the first MOSFET 5. That is, the first MOSFET 5 is generally in ON state, and a potential applied to the drain 61 of the second MOSFET 6 and the source 72 of the third MOSFET 7 is switched between low and high, whereby the two-way current path can be formed. When the direction of the current flow is changed from one direction to another, the first MOSFET 5 is turned off. During this off period of the main switch, i.e., the first MOSFET 5, the second MOSFET 6 and the third MOSFET 7 operate to allow current conduction. For this reason, the on-resistance of these MOSFETs does not have to be significantly low.

Accordingly, the chip size of the second and third MOSFETs 6 and 7 can be sufficiently reduced compared to that of the first MOSFET 5. For example, by reducing the chip size of the second and third MOSFETs 6 and 7 to less than half the chip size of the first MOSFET 5, the switching element 3 can be smaller than the conventional two-way switching element 86 in which two MOSFETs with the same chip size are connected in series.

Alternatively, if the chip size of the conventional two-way switching element 86 is intended to be maintained, it is possible to increase the chip size of the first MOSFET 5 and thus to reduce the ON resistance of the switching element 3.

Figure 2A:
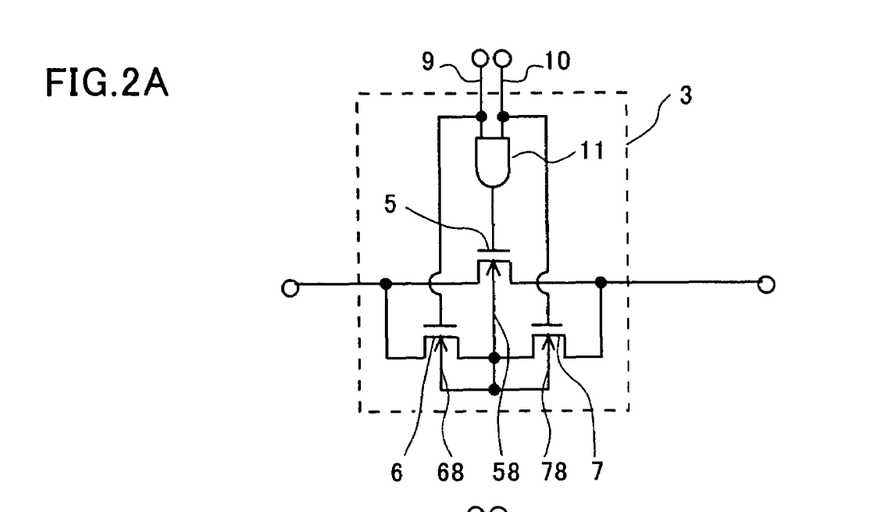
FIG. 2A is a circuit diagram for explaining the switching element according to a second embodiment of the present invention.

Next, a second embodiment of the present invention will be described with reference to FIGS. 2A and 2B. FIG. 2A is a circuit diagram of a switching element 3, and FIG. 2B is schematic cross section showing the structure of the switching element 3.

Figure 2B:
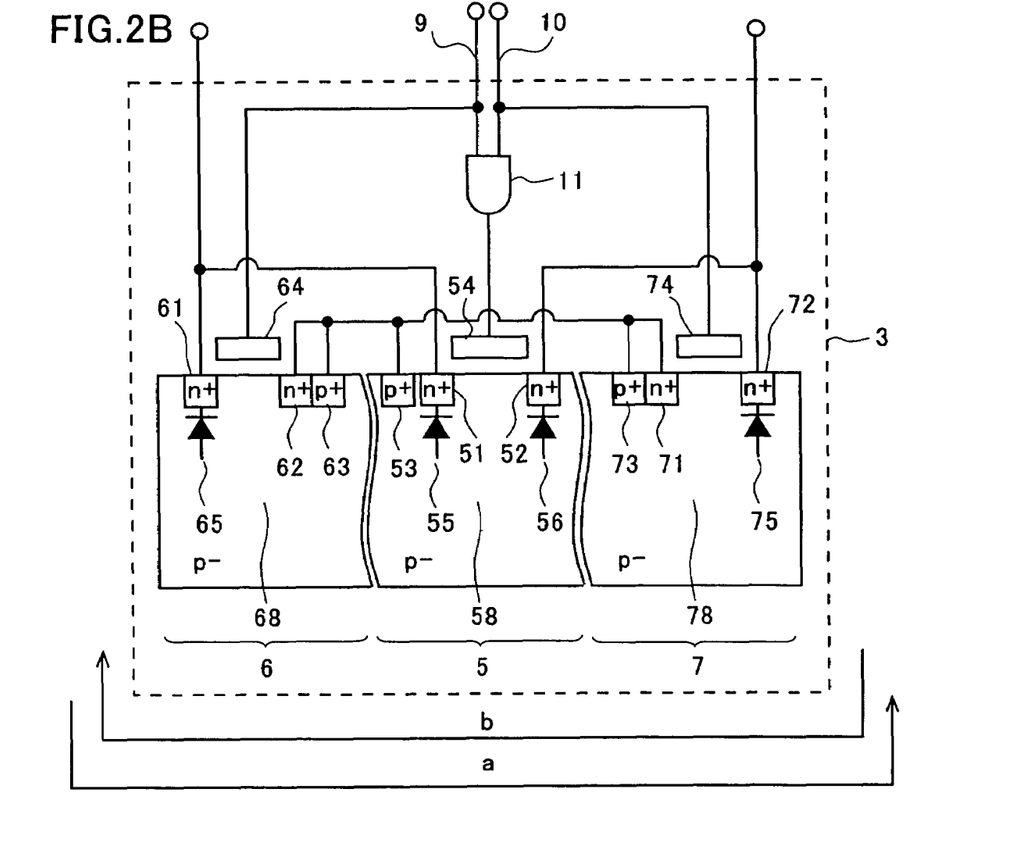
FIG. 2B is a schematic cross section of the circuit diagram for explaining the switching element according to the second embodiment of the present invention.

As shown in FIGS. 2A and 2B, the second embodiment is one where an AND gate circuit 11 is connected to the switching element 3 of the first embodiment.

In the switching element 3 shown in FIG. 1, one of the two switches, i.e., the second and third MOSFETs 6 and 7, has to be switched off when a first MOSFET 5 is turned off. For this reason, by connecting the AND gate circuit 11 to the switching element 3, gates 54, 64 and 74 of the MOSFETs can be simultaneously controlled by two input signals (control signals).

To be more specific, as shown in FIGS. 2A and 2B, first and second control terminals 9 and 10, constituting the input of the AND gate circuit 11, are connected to the gate 64 of the second MOSFET 6 and the gate 74 of the third MOSFET 7, respectively. The output of the AND gate circuit 11 is connected to the gate 54 of the first MOSFET 5.

The AND gate circuit 11 performs a logical operation for the two input signals (control signals) and outputs the result to the first MOSFET 5, constituting a circuit for turning off the gate 54 and turning off any one of the gates 64 and 74 by means of the two input signals of the AND gate circuit 11.

To be more specific, when both the first and second control terminals 9 and 10 are in "H" level, the first, second and third MOSFETs 5, 6 and 7 are all turned on, and thereby a current path is formed in accordance with the potentials of drain 61 and source 72.

In addition, when the first control terminal 9 is in "H" level and the second control terminal 10 is in "L" level, the second MOSFET 6 is turned on and the first and third MOSFETs 5 and 7 are turned off. Accordingly, the current path shown by the arrow "a" is formed when the drain 61 has high potential (H) and the source 72 has low potential (L).

Furthermore, when the first control terminal 9 is in "L" level and the second control terminal 10 is in "H" level, the third MOSFET 7 is turned on and the first and second MOSFETs 5 and 6 are turned off. Accordingly, the current path shown by the arrow "b" is formed when the drain 61 has low potential (L) and the source 72 has high potential (H).

Note that, when both the first and second control terminals 9 and 10 are in "L" level, the first, second and third MOSFETs 5, 6 and 7 are all turned off. Thus, no current paths shown by the arrows "a" and "b" are formed.

The use of the AND gate circuit 11 in this way can reduce the number of terminals to 2, which was 3 in the switching element 3 of the first embodiment. It should be noted that other components are similar to those in the first embodiment, and therefore their descriptions are omitted here.

Figure 3:
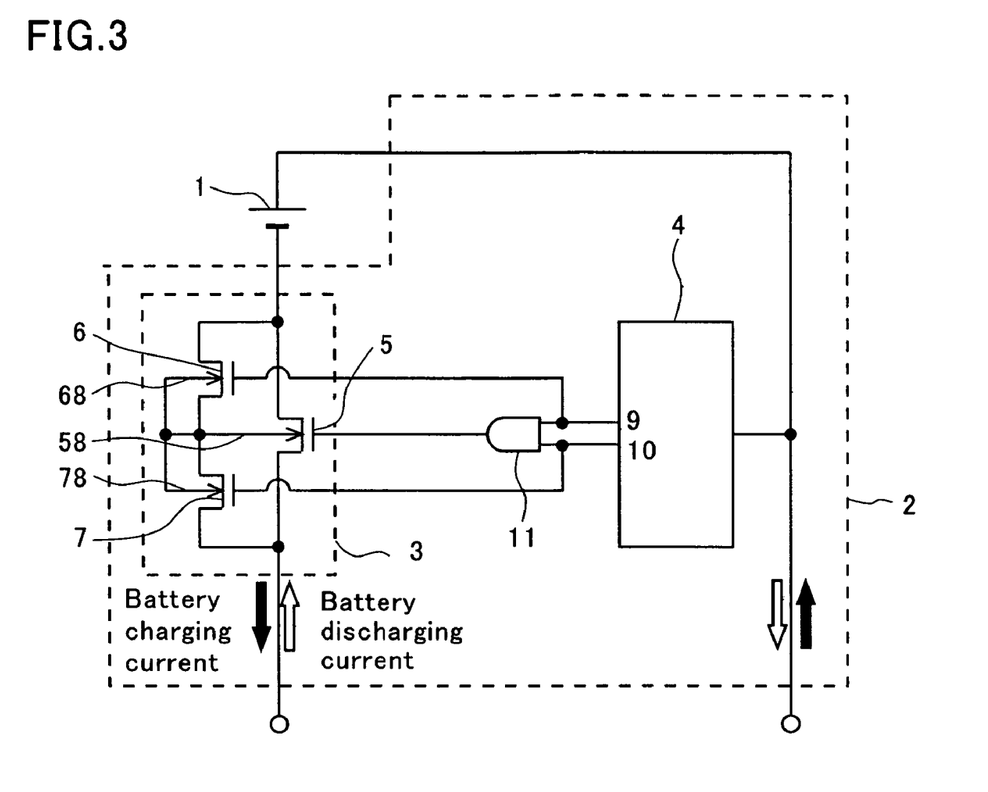
FIG. 3 is a circuit diagram of a protection circuit according to a third embodiment of the present invention.
Figure 4:
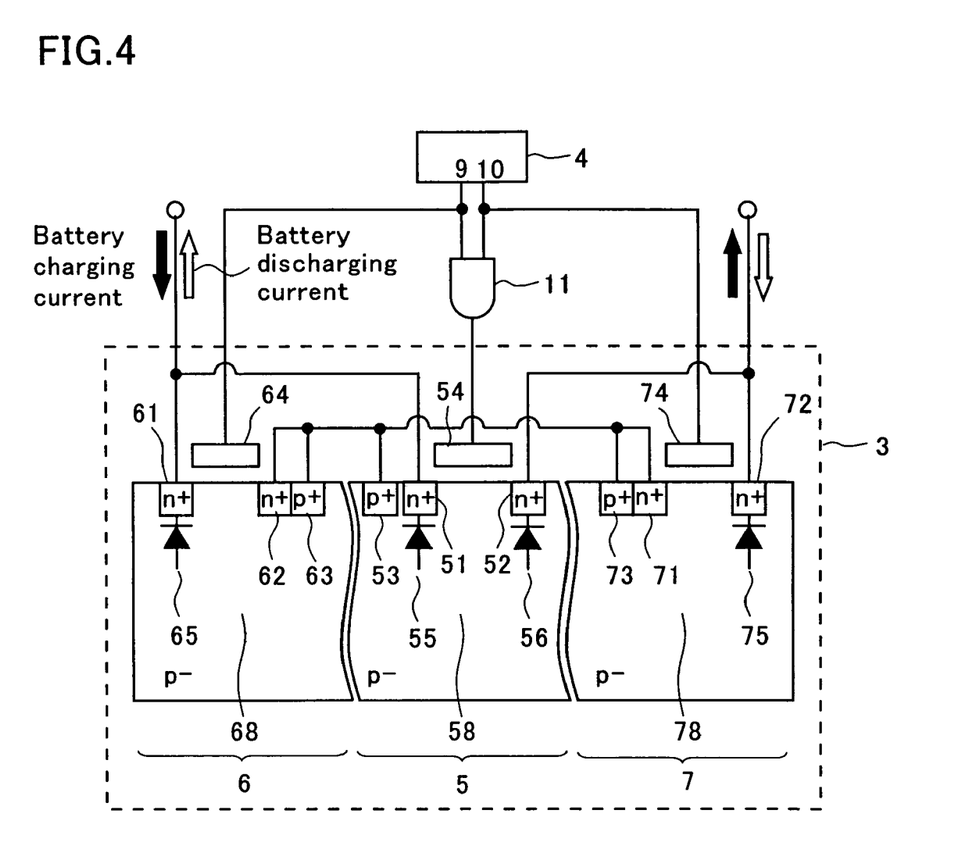
FIG. 4 is a schematic cross section of the protection circuit according to the third embodiment of the present invention.

FIGS. 3 and 4 show a third embodiment of the present invention, where the switching element described above is used for a protection circuit.

FIG. 3 is a circuit diagram showing a protection circuit, where a protection circuit of a secondary battery is described by way of example.

A protection circuit 2 is connected in series to a secondary battery 1, and includes a switching element 3, an AND gate circuit 11 and a control circuit 4. Here, by way of example, the protection circuit 2 has such a configuration in which the switching element 3 of the first embodiment is connected to the AND gate circuit 11.

The switching element 3 is constituted of a first MOSFET 5, a second MOSFET 6 and a third MOSFET 7. Note that, details of these MOSFETs are similar to those in the first and second embodiments, and therefore their descriptions are omitted.

The first MOSFET 5 is connected in series to the secondary battery 1 and prevents the secondary battery 1 from being overcharged or overdischarged. The second MOSFET 6 is configured in such a way that when the secondary battery 1 is overcharged, it allows a current to flow in the direction in which the secondary battery 1 discharges by use of one of the two parasitic diodes 55 and 56 incorporated in the first MOSFET 5. The third MOSFET 7 is configured in such a way that when the secondary battery 1 is overdischarged, it allows a current to flow in the direction in which the secondary battery 1 charges by use of another one of parasitic diodes 55 and 56 incorporated in the first MOSFET 5.

The control circuit 4 includes a first control terminal 9 for controlling the ON/OFF state of the second MOSFET 6, and a second control terminal 10 for controlling the ON/OFF state of the third MOSFET 7.

The AND gate circuit 11 performs logical operations for the outputs of the first and second control terminals 9 and 10 that are provided to the control circuit 4, and outputs the result to the first MOSFET 5.

The control circuit 4 switches the MOSFETs 5, 6 and 7 on if the battery voltage is in a range between the minimum set voltage and the maximum set voltage, allowing a current to flow in the directions in which the secondary battery 1 charges and discharges.

Although a detailed description will be provided later, when the battery voltage becomes higher than the maximum set voltage, the control circuit 4 switches the first MOSFET 5 off. At this time, the control circuit 4 switches the second MOSFET 6 off based on the output from the first control terminal 9, and switches the third MOSFET 7 on based on the output from the second control terminal 10, thereby allowing a current to flow in the direction in which the secondary battery 1 discharges.

When the battery voltage is lower than the minimum set voltage, the control circuit 4 switches the first MOSFET 5 off. At this time, the control circuit 4 switches the second MOSFET 6 on based on the output from the first control terminal 9, and switches the third MOSFET 7 off based on the output from the second control terminal 10, thereby allowing a current to flow in the direction in which the secondary battery 1 charges. Note that, detailed descriptions thereof will be provided later.

FIG. 4 is a schematic cross section showing the structure of the protection circuit 2. The protection circuit 2 is similar to those in the first and second embodiments, with exception that the control circuit 4 for applying control signals to the AND gate circuit 11 is connected thereto. For this reason, descriptions for overlapped portions are omitted.

A gate 64 of the second MOSFET 6 is controlled by the output of the first control terminal 9. A gate 74 of the third MOSFET 7 is controlled by the output of the second control terminal 10. A gate 54 of the first MOSFET 5 is controlled by the outputs of the first and second control terminals 9 and 10 via the AND gate circuit 11.

In addition, the parasitic diodes 55 and 56 incorporated in the first MOSFET 5 are switched by the parasitic diodes 65 and 75 that operate by switching the second and third MOSFETs 6 and 7 between ON and OFF. Thus, when the first MOSFET 5 is turned off, one of the following current paths are formed: the current path where a current flows in the charge direction, and the current path where a current flows in the discharge direction.

The control circuit 4 provided to the protection circuit 2 operates in the manner described below to control the switching element (overcharge/overdischarge-prevention switch) 3, and prevents the secondary battery 1 from being overcharged and overdischarged.

[When the Secondary Battery is Discharged]

Since the current path is formed in the direction in which the secondary battery 1 discharges, a source 72 has high potential (H) and a drain 61 has low potential (L).

(When the Battery Voltage Becomes Higher than the Maximum Set Voltage)

The first control terminal 9 outputs "L" and switches the first MOSFET 5 off. At this time, the second control terminal 10 outputs "H" and switches the third MOSFET 7 on. Since the source 72 and the drain 61 are in "H" level and "L" level, respectively, a current is allowed to flow in the parasitic diode 55 incorporated in the first MOSFET 5, forming the current path in the direction in which the secondary battery 1 discharges. On the other hand, a current never flows in the direction in which the secondary battery 1 charges.

To be more specific, a current that flows in the direction in which the secondary battery 1 discharges flows from the third MOSFET 7 toward a back-gate 58 of the first MOSFET 5 and a back-gate 68 of the second MOSFET 6. The current continues to flow via the parasitic diodes 55 and 65.

(When the Battery Voltage is Between the Minimum Set Voltage and the Maximum Set Voltage)

The first and second control terminals 9 and 10 output "H" and switch the first, second and third MOSFETs 5, 6 and 7 on. At this time, a current flows mainly via the first MOSFET 5. A current also flows in the second and third MOSFETs 6 and 7. Since the source 72 is in "H" level and the drain 61 is in "L" level, the current path is formed in the direction in which the secondary battery discharges.

(When the Battery Voltage Becomes Lower than the Minimum Set Voltage)

If the battery voltage becomes lower than the minimum set voltage when the secondary battery 1 is discharged, the current path in the discharge direction is interrupted in order to prevent the secondary battery 1 from being overdischarged. In this case, however, the secondary battery 1 needs to be charged and accordingly, the current path is switched in the charge direction. That is, the source 72 is set to have low potential (L) and the drain 61 is set to have high potential (H).

The second control terminal 10 outputs "L" and switches the first and third MOSFETs 5 and 7 off. At this time, the first control terminal 9 outputs "H" and switches the second MOSFET 6 on. Since the source 72 and the drain 61 are in "L" level and "H" level, respectively, a current is allowed to flow in the parasitic diode 56 incorporated in the first MOSFET 5, forming the current path in the direction in which the secondary battery 1 charges. On the other hand, a current never flows in the direction in which the secondary battery 1 discharges.

To be more specific, a current that flows in the direction in which the secondary battery 1 charges flows from the second MOSFET 6 toward the back-gate 58 of the first MOSFET 5 and a back-gate 78 of the third MOSFET 7. The current continues to flow via the parasitic diodes 56 and 75.

[When the Secondary Battery is Charged]

Since the current path is formed in the direction in which the secondary battery 1 charges, the source 72 has lower potential (L) and the drain 61 has high potential (H).

(When the Battery Voltage is Lower than the Minimum Set Voltage)

The second control terminal 10 outputs "L" and switches the first and third MOSFETs 5 and 7 off. At this time, the first control terminal 9 outputs "H" and switches the second MOSFET 6 on. Since the source 72 and the drain 61 are in "L" level and "H" level, respectively, a current is allowed to flow in the parasitic diode 56 incorporated in the first MOSFET 5, forming the current path in the direction in which the secondary battery 1 charges. On the other hand, a current never flows in the direction in which the secondary battery 1 discharges.

To be more specific, a current that flows in the direction in which the secondary battery 1 charges flows from the second MOSFET 6 toward the back-gate 58 of the first MOSFET 5 and the back-gate 78 of the third MOSFET 7. The current continues to flow via the parasitic diodes 56 and 75.

(When the Battery Voltage is Between the Minimum Set Voltage and the Maximum Set Voltage)

The first and second control terminals 9 and 10 output "H" and turns on the first, second and third MOSFETs 5, 6 and 7. At this time, although a current flows mainly via the first MOSFET 5, a current also flows in the second and third MOSFETs 6 and 7. Since the source 72 is in "L" level and the drain 61 is in "H" level, the current path is formed in the direction in which the secondary battery 1 charges.

(When the Battery Voltage Becomes Higher than the Maximum Set Voltage)

If the battery voltage becomes higher than the maximum set voltage when the secondary battery 1 is charged, the current path in the charge direction is interrupted in order to prevent the secondary battery 1 from being overcharged. In this case, however, the secondary battery 1 needs to be discharged and accordingly, the current path is switched in the discharge direction. That is, the source 72 is set to have high potential (H) and the drain 61 is set to have low potential (L).

The first control terminal 9 outputs "L" and switches the first and second MOSFETs 5 and 6 off. At this time, the second control terminal 10 outputs "H" and switches the third MOSFET 7 on. Since the source 72 and the drain 61 are in "H" level and "L" level, respectively, a current is allowed to flow in the parasitic diode 55 incorporated in the first MOSFET 5, forming the current path in the direction in which the secondary battery 1 discharges. On the other hand, a current never flows in the direction in which the secondary battery 1 charges.

To be more specific, a current that flows in the direction in which the secondary battery 1 discharges flows from the third MOSFET 7 toward the back-gate 58 of the first MOSFET 5 and the back-gate 68 of the second MOSFET 6. The current continues to flow via the parasitic diodes 55 and 65.

In the second and third MOSFETs 6 and 7, a current mainly flows while the secondary battery 1 is attempting to return to the normal state from the overcharged state or overdischarged state. For this reason, there in not much need to consider the ON resistance as in the first MOSFET 5 where a current flows mainly in the normal state.

Thus, the size of the second and third MOSFETs 6 and 7 can be sufficiently smaller than the first MOSFET 5. For example, if the size of the second and third MOSFETs 6 and 7 is less than half the size of the first MOSFET 5, the chip size can be smaller than that of the conventional two-way switching element 86.

In some cases, the protection circuit 2 performs control operations by detecting the resistance (ON resistance) of the switching element 3. Therefore, it is sometimes desirable for the switching element 3 to have a design that allows it to maintain a predetermined ON resistance value. Specifically, when the conventional ON resistance is maintained, it is possible to reduce the chip size to about ¼, according to the present embodiment.

A detailed description thereof will be provided below. For example, the ON resistance and size of the conventional MOSFETs 82 and 83 (shown in FIG. 5) are assumed to be 20 $m\Omega$ and 2 $mm^2$, respectively, which in turn means that the conventional two-way switching element 86 has an ON resistance of 40 $m\Omega$ and a chip size (occupied area) of 4 $mm^2$.

Meanwhile, since it is possible to sufficiently minimize the chip size of the second and third MOSFETs 6 and 7 in the third embodiment, when the conventional ON resistance (40 $m\Omega$) is maintained, the chip size of the switching element 3 can be reduced as small as 1 $mm^2$. That is, the chip size of the switching element 3 can be reduced to about ¼.

It should be noted that the protection device of the third embodiment has been described by taking a protection device provided with the AND gate circuit 11 as an example. The switching element 3 can reduce the number of the input terminals thereof to 2 by using the AND gate circuit 11. For example, the two-way switching element 86 in a conventional control IC 87 has two control terminals, providing an advantage that the use of the AND gate circuit 11 eliminates the need to change the number of terminals for implementation of the third embodiment.

Meanwhile, the third embodiment can be similarly implemented even when the AND gate circuit 11 is not provided and thus the switching element 3 in the first embodiment is controlled by the control circuit 4. The elimination of the need for the AND gate circuit 11 contributes to miniaturization of the switching element 3 and to the reduction in the number of components.

It should be noted that although a lateral n-channel MOSFET is used for the MOSFETs 5, 6 and 7 provided in the switching element 3 and the protection circuit 2, MOSFETs are not limited to this. A p-channel MOSFET may be used, and similar effects can also be obtained when a vertical MOSFET is used. In addition, the switching element 3 of the embodiments may be applicable as a line switch in a two-way switching system.

According to the embodiments of the present invention, the two parasitic diodes of the first switching element can be switched by the second and third switching elements. It is sufficient for the second and third switching elements to switch the current path in two directions, and they may be of smaller chip size than the first switching element. For this reason, it is possible to provide a two-way switching element that is much smaller than the conventional two-way switching element.

In addition, the AND gate circuit is provided, the input of the AND gate circuit is connected to the control terminals respectively of the second and third switching elements, and the output of the AND gate circuit is connected to the control terminal of the first switching element. Thus, the switching element can operate using two control signals.

This provides an advantage that a control circuit, controlling the conventional two-way switching element, can be utilized without changing the number of its output terminals, for example.

Moreover, adoption of the switching element described above to a protection circuit for secondary batteries significantly reduces the size of switching elements for preventing a secondary battery from being overcharged and overdischarged, thereby achieving reduced manufacturing costs.

The protection circuit performs control operations by detecting the resistance value (ON resistance) of the switching element in some cases, and therefore, it is sometimes desirable for the switching element to have a design that allows it to maintain a predetermined ON resistance value. Specifically, when the predetermined ON resistance is maintained, it is possible to reduce the chip size to about ¼ the chip size of the two-way switching element used in the conventional protection circuit, according to the present embodiment.

Furthermore, the following advantage is provided: that is, the control circuit used in the conventional protection circuit can be utilized without changing the number of its output terminals.

What is claimed is:

1. A switching device comprising:
a first switching element, a second switching element and a third switching element, each of the switching elements comprising a control terminal, a first power terminal, a second power terminal, a gate and a back gate,
wherein the first power terminal of the second switching element is connected with the first power terminal of the first switching element, and the second power terminal of the second switching element is connected with the back gates of the first and second switching elements,
the first power terminal of third switching element is connected with the second power terminal of the first switching element, and the second power terminal of the third switching element is connected with the back gates of the first and third switching elements, and
the gate of the second switching element is connected with neither of the first and second power terminals nor the back gate of the first switching element, and the gate of the third switching element is connected with neither of the first and second power terminals nor the back gate of the first switching element.

2. The switching device of claim 1, further comprising an AND gate circuit comprising a first input terminal connected with the control terminal of the second switching element, a second input terminal connected with the control terminal of the third switching element, and an output terminal connected with the control terminal of the first switching element.

3. The switching device of claim 1, further comprising a first external terminal connected with the first power terminal of the first switching element and a second external terminal connected with the second power terminal of the first switching element,
wherein the second switching element or the third switching element is turned off when the first switching element is turned off so that a direction of current flow between the first and second external terminals is reversed.

4. The switching device of claim 1, wherein
the first switching element comprises two parasitic diodes, the second switching element comprises a parasitic diode, and the third switching element comprises a parasitic diode, and the switching device is configured so that, when the first switching element is turned off, one of the parasitic diodes of the first switching element is turned on and another of the parasitic diodes of the first switching element is turned off.

5. The switching device of claim 1, wherein a size of each of the second and third switching elements is less than half a size of the first switching element.

6. A protection circuit for a secondary battery, comprising:
a switching device comprising a first switching element, a second switching element and a third switching element, the first switching element being connected with the secondary battery in series, the second switching element being connected with the third switching element in series, and the connected second and third switching elements as a whole being connected with the first switching element in parallel; and
a control device controlling the first, second and third switching elements so that the secondary battery is charged when a current flows in a first direction through the switching device and the secondary battery is discharged when a current flows in a second direction through the switching device,
wherein each of the switching elements comprises a control terminal, a first power terminal, a second power terminal, a gate and a back gate,
the first power terminal of the second switching element is connected with the first power terminal of the first switching element, and the second power terminal of the second switching element is connected with the back gates of the first and second switching elements,
the first power terminal of third switching element is connected with the second power terminal of the first switching element, and the second power terminal of the third switching element is connected with the back gates of the first and third switching elements,
the gate of the second switching element is connected with neither of the first and second power terminals nor the back gate of the first switching element, and the gate of the third switching element is connected with neither of the first and second power terminals nor the back gate of the first switching element, and
the control device turns off the first and second switching elements when a voltage of the secondary battery is higher than a predetermined voltage, so that the secondary battery is discharged thorough the turned-off first switching element and the turned-on third switching element.

7. The protection circuit of claim 6, wherein the first switching element comprises two parasitic diodes and the second switching element comprises a parasitic diode, and the secondary battery is discharged thorough one of the parasitic diodes of first switching element and the parasitic diode of the second switching element.

8. The protection circuit of claim 6, wherein a size of each of the second and third switching elements is less than half a size of the first switching element.

9. A protection circuit for a secondary battery, comprising:
a switching device comprising a first switching element, a second switching element and a third switching element, the first switching element being connected with the secondary battery in series, the second switching element being connected with the third switching element in series, and the connected second and third switching elements as a whole being connected with the first switching element in parallel; and
a control device controlling the first, second and third switching elements so that the secondary battery is charged when a current flows in a first direction through the switching device and the secondary battery is discharged when a current flows in a second direction through the switching device,
wherein each of the switching elements comprises a control terminal, a first power terminal, a second power terminal, a gate and a back gate,
the first power terminal of the second switching element is connected with the first power terminal of the first switching element, and the second power terminal of the second switching element is connected with the back gates of the first and second switching elements,
the first power terminal of third switching element is connected with the second power terminal of the first switching element, and the second power terminal of the third switching element is connected with the back gates of the first and third switching elements,
the gate of the second switching element is connected with neither of the first and second power terminals nor the back gate of the first switching element, and the gate of the third switching element is connected with neither of the first and second power terminals nor the back gate of the first switching element, and
the control device turns off the first and third switching elements when a voltage of the secondary battery is lower than a predetermined voltage, so that the secondary battery is charged thorough the turned-off first switching element and the turned-on second switching elements.

10. The protection circuit of claim 9, wherein the first switching element comprises two parasitic diodes and the third switching element comprises a parasitic diode, and the secondary battery is charged thorough one of the parasitic diodes of first switching element and the parasitic diode of the third switching element.

11. The protection circuit of claim 9, wherein a size of each of the second and third switching elements is less than half a size of the first switching element.

* * * * *